United States Patent [19]
Pryor

[11] Patent Number: 5,130,111
[45] Date of Patent: Jul. 14, 1992

[54] SYNTHETIC DIAMOND ARTICLES AND THEIR METHOD OF MANUFACTURE

[75] Inventor: Roger W. Pryor, Bloomfield Township, Oakland County, Mich.

[73] Assignee: Wayne State University, Board of Governors, Detroit, Mich.

[21] Appl. No.: 398,690

[22] Filed: Aug. 25, 1989

[51] Int. Cl.$^5$ .................. C23C 16/26; C30B 29/04
[52] U.S. Cl. ............... 423/446; 156/DIG. 68; 427/249; 501/86
[58] Field of Search .............. 423/446; 156/DIG. 68, 156/631; 501/86; 204/157.47; 249/115; 427/249

[56] References Cited

U.S. PATENT DOCUMENTS

| | | | |
|---|---|---|---|
| 3,621,565 | 11/1971 | Sandstrom et al. | 156/631 |
| 3,959,045 | 5/1976 | Antypas | 148/DIG. 135 |
| 4,255,208 | 3/1981 | Deutscher et al. | 148/DIG. 135 |
| 4,490,229 | 12/1984 | Mirtich et al. | 423/446 |
| 4,512,825 | 4/1985 | Addamiano et al. | 148/DIG. 135 |
| 4,767,517 | 8/1988 | Hiraki | 204/192.25 |
| 4,767,608 | 8/1988 | Matusmoto et al. | 423/446 |
| 5,006,203 | 4/1991 | Purdes | 423/446 |

FOREIGN PATENT DOCUMENTS

| | | |
|---|---|---|
| 2050311 | 4/1977 | Japan . |
| 39834 | 4/1981 | Japan . |
| 0141697 | 7/1985 | Japan ................. 423/446 |
| 1510097 | 7/1986 | Japan ................. 423/446 |
| 303891 | 12/1988 | Japan . |
| 1-104761 | 4/1989 | Japan . |
| WO12754 | 11/1990 | PCT Int'l Appl. . |

OTHER PUBLICATIONS

Perry, *Chemical Engineers Handbook*, 4th Ed., McGraw Hill Book Co., Inc, 1963, pp. 3-95-3-96.
*Webster's New International Dictionary*, 2nd Ed., G & C Merriam Co. Publishers, 1959, p. 239.
"A Merging Technology of Diamond Thin-Films", *Chemical and Engineering News*, vol. 67, No. 20 (May 25, 1989).

*Primary Examiner*—Michael Lewis
*Assistant Examiner*—Stephen G. Kalinchak
*Attorney, Agent, or Firm*—Dykema Gossett

[57] ABSTRACT

Shaped synthetic articles are fabricated by vapor deposition of synthetic diamond on releasable molds. A process is also provided for forming a shaped synthetic diamond article by coating a mold with an etchable layer and then depositing synthetic diamond on the etchable layer. The etchable layer is thereafter removed in an etchant bath, releasing the diamond article from the mold. The synthetic diamond articles are useful as high-temperature, corrosion resistant vessels and as wear surfaces.

2 Claims, 1 Drawing Sheet

SYNTHETIC DIAMOND ARTICLES AND THEIR METHOD OF MANUFACTURE

TECHNICAL FIELD

The present invention deals generally with methods of forming synthetic diamond. More specifically, the present invention relates to processes for fabricating diamond articles having predetermined geometries and to the articles so produced.

BACKGROUND OF THE INVENTION

As a gemstone, diamond is known for its rarity and beauty. As an industrial material, its superior hardness and wear resistance make diamond a preferred material in a variety of applications. For example, diamond is used extensively as an abrasive in polishing operations, and diamond-tipped drills and cutting tools are indispensable in shaping extremely hard materials such as sintered carbide and quartz. To help meet the industrial demand for diamond, a number of techniques have been developed by others for the production of synthetic diamond. While natural diamond is still used in many industrial applications, diamond synthesis is emerging as the solution to the problem of inadequate supply of this unique material.

Diamond has a cubic lattice, with each carbon atom being covalently bonded to four other carbons to form a tetrahedron. This structure is repeated throughout the crystal and it is believed that this network of carbon-carbon bonds produces the extreme hardness of diamond which is unequalled by other materials. It was found that at high temperatures and pressures, the conversion of carbon to diamond occurs at an appreciable rate. This phenomenon gave rise to the first synthetic high-pressure diamonds in the early 1950's.

With the use of massive high-pressure presses and through another high-pressure technique—shock wave diamond synthesis—many tons of diamond grit are synthesized annually throughout the world. High-pressure techniques have also recently been used to synthesize relatively large single crystal diamonds which are laser cut to form heat sinks for electronic devices. It will be appreciated that diamond is useful in this type of application due to its high thermal conductivity.

Due in part to the numerous limitations inherent in high-pressure diamond synthesis processes, much effort has been made to develop alternative techniques. As a result, methods have been developed by which diamond thin films can now be formed on selected substrates. Diamond thin films are of significant interest to the electronics industry and, as will be appreciated by those skilled in the art, diamond thin films may be doped to produce n-type and p-type diamond layers.

Previous deposition experiments have established some of the preliminary techniques currently used in diamond synthesis. However, much development is needed to fabricate reproducable films reliably. This document presents such a new approach to reliable nucleation and growth of diamond materials. In the past, diamond was only able to be grown on selected substrates by the thermal or plasma decomposition of a single carbon-containing gas or a single mix of carbon-containing gases. For example, Eversole, Angus and others simultaneously deposited diamond and graphite on diamond seed crystals and then removed the graphite by hydrogen etching. Later, Russian workers utilized a mixture of methane and hydrogen based on Angus's work to produce a diamond film on a diamond substrate in a process in which hydrogen inhibited graphite formation. The graphite which did form was removed with an atomic hydrogen etch. These efforts were refined somewhat and finally resulted in the growth of diamond on non-diamond substrates.

Chemical vapor deposition of diamond has been achieved through the use of heated-filaments, direct current plasmas, RF plasmas and microwave initiated gas plasmas in both high and low pressure environments. The feedstock gas is typically a mixture of hydrogen and methane. The hydrogen component dissociates to form atomic hydrogen. The methane component also dissociates, presumably forming $CH_3$ radicals which are believed to be instrumental in promoting diamond growth. In U.S. Pat. No. 4,767,608 to Matsumoto, the formation of bulk-form diamond on a substrate by electric plasma discharge is disclosed. It is also known to etch away a substrate to produce bulk-form diamond.

In particular, microwave plasma deposition of diamond has received considerable attention as a viable commercial system for producing diamond thin films. Typically, a frequency of 2.45 GHz is utilized to dissociate a feedstock gas mixture of hydrogen and a carbon source such as methane or acetylene. As previously stated, the microwave radiation dissociates the feedstock gases to produce atomic hydrogen and active carbon species. Typically, the process is carried out at pressures between 10 to 100 torr. The substrate is positioned on a heated support to maintain the substrate at a temperature of between about 500° C. and 1,100° C. Polycrystalline diamond films with some non-diamond carbon content can be formed in this manner over a large substrate area. The crystallites formed are typically between 25 nanometers and 25 microns in size.

As stated, non-diamond substrates have also been used successfully for the production of synthetic diamond films. Such substrates include several metals, for example, nickel, copper and titanium, as well as ceramics, carbides, nitrides, sapphire, silicon and graphite. Other non-diamond substrates are also known. As will be appreciated by those skilled in the art, a suitable substrate must provide sufficient nucleation sites to support adequate diamond growth.

To Applicant's knowledge, he is the first to utilize a vapor deposition process of diamond on a releasable substrate to form shaped diamond articles and to do so in a two-step, nucleation/growth process utilizing two different gas mixtures. Therefore, it is an object of the present invention to provide methods by which shaped synthetic diamond articles can be formed on releasable molds. It is a further object of the present invention to provide near-net shape synthetic diamond articles formed by vapor deposition of diamond on releasable molds. It is still a further object of the present invention to provide a method by which shaped synthetic diamond articles can be formed on adherent, etch-resistant molds by vapor deposition.

SUMMARY OF THE INVENTION

In accordance with the present invention, in one aspect there is provided a process for fabricating shaped diamond articles by vapor deposition. In a preferred embodiment, the vapor deposition stage is a two-step process. The process includes the steps of creating a chemical vapor having an active carbon species capable of forming a high-density diamond polycrystalline deposit on a preselected substrate and providing a mold having a predetermined configuration. At least the outer surface of the mold comprises a material capable of nucleating diamond growth from the chemical vapor. The material from which the mold is formed also has the ability to release the layer of diamond formed thereon by vapor deposition. In other words, the mold is "releasable" with respect to the diamond article which will be formed on the mold. The particular characteristics of the mold will be more fully described hereinafter.

Utilizing the chemical vapor which contains the active carbon source, a layer of synthetic diamond is formed on the mold by subjecting the mold to the chemical vapor. This step is performed under conditions by which diamond growth is initiated at preferred nucleation sites. In one embodiment, the mold is first subjected to a chemical vapor which optimizes surface nucleation and, after nucleation, the gas mix is changed to optimize diamond growth. In both embodiments, as the diamond growth continues on the surface of the mold, an object of synthetic diamond is formed. It will be recognized that the synthetic diamond layer will take on the shape of the mold. After the deposition or growth of the synthetic diamond layer on the mold, the synthetic diamond article is removed from the mold. A number of useful diamond articles can be produced in accordance with the present invention, including near-net shape diamond articles. The present invention also contemplates shaped diamond articles manufactured in accordance with the method of the present invention.

In a still another aspect, the present invention provides a method of forming shaped diamond articles which utilizes an intermediate layer of material. In this aspect, a chemical vapor is provided which includes an active carbon species capable of forming a diamond deposit on a preselected substrate. A mold is formed of a first material which is generally resistant to a preselected etchant. A layer of material which is etchable in a predetermined etchant is then disposed as a coating or layer on the mold. This etchable layer allows the nucleation and the growth of diamond from the chemical vapors. In most instances, the outer surface of the etchable layer will take on the configuration of the underlying mold. The mold with the etchable coating or layer thereon, is then exposed to the chemical vapors for a period of time sufficient to allow the nucleation and growth of a diamond layer overlying the etchable layer. In this manner, a shaped diamond article having the configuration of the etchable layer is formed.

Following the formation of a synthetic diamond layer, the layered structure is contacted with an etchant which selectively etche away the etchable layer. In this manner, the diamond article may then be removed from the mold. The present invention also contemplates diamond articles produced by the intermediate layer method of the present invention.

These and other meritorious features and advantages of the present invention will be more fully described in connection with the following description of the preferred embodiments of the invention and with reference to the drawings in which:

DETAILED DESCRIPTION OF THE INVENTION

Figure 1:
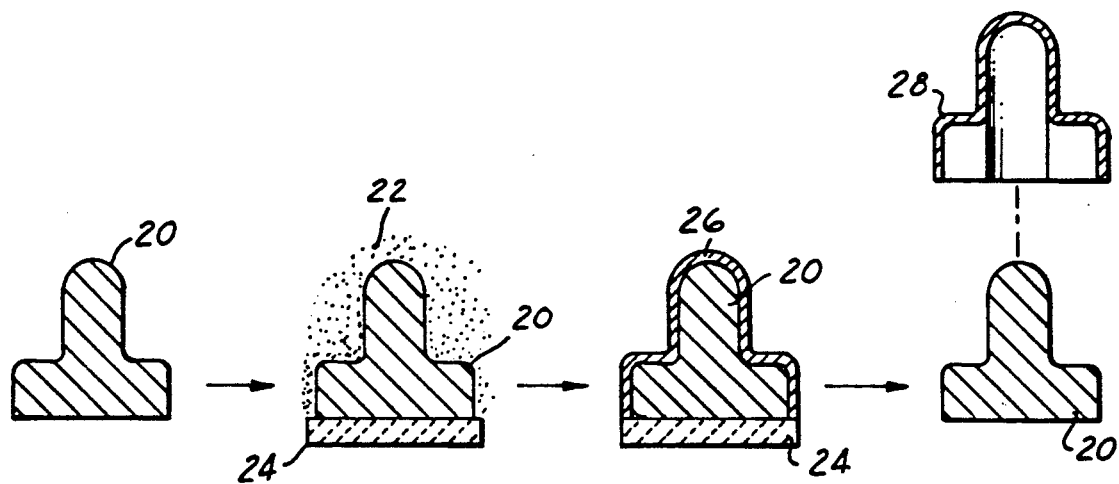
FIG. 1 illustrates the process steps of the present invention as well as a shaped diamond article made in accordance with the inventive process.

Turning now to FIG. 1 of the drawings, in a preferred embodiment of the present invention, form or mold 20 is provided having a predetermined configuration or shape upon which the synthetic diamond article to be formed will be patterned. It is to be understood that mold 20 is not a simple planar surface. That is, as used herein, "mold," "non-planar mold" or "compound planar mold" shall mean an article which has a surface or surfaces on which diamond will be deposited, where said surface is not a planar surface. Of course, the mold may include planar surfaces which intersect at an angle or the like with one another or with a curved surface. Thus, "mold" is to be distinguished from a single planar surface such as prior art synthetic diamond deposition on a planar silicon wafer or the like. In this particular embodiment, mold 20 is a mandrel upon which a synthetic diamond vessel or container will be formed. It is anticipated that the present invention will be useful also in providing solid diamond articles having convex surfaces and in some designs, concave surfaces, through the use of molds having cavities or the like, and such use is specifically contemplated as falling within the scope of the invention.

An important feature of the present invention is the utilization of a material to form mold 20 which is releasable with respect to a synthetic diamond article fabricated by vapor deposition on mold 20. A suitable material for forming mold 20 should be capable of supporting the nucleation of diamond from the appropriate gas or gas mixture and yet must yield to the intact removal of the formed diamond article from mold 20. In the most preferred embodiment of the present invention, there should exist a significant differential between the coefficient of thermal expansion of the material used to form mold 20 and that of the synthetic diamond deposited on the mold. As will be explained more fully, the deposition process can occur at a relatively high temperature. Upon cooling, this differential renders the mold releasable with respect to the shaped diamond article due to the large stress created at the interface and the resulting shear forces.

One particularly preferred material for use in forming mold 20 is nickel. Another preferred material is nickel-plated copper. Other bimetallic or composite molds may also be suitable. Copper, tungsten and molybdenum may also be suitable in particular applications. It may also be possible to form synthetic diamond articles having openings such as windows or the like by providing a bimetallic mold, where one material provides nucleation for diamond growth and the other material does not support diamond growth. In this fashion a gap in the diamond article is formed in the non-nucleating region. Where mold 20 is metal, it may be machined, cast or otherwise formed into the desired predetermined configuration.

Although the optimum nucleation density may vary in a particular application, in some instances it may be desirable to form a mold 20 of a material having a high nucleation density. It is believed that high nucleation densities result in the formation of small crystallites in columnar form that may exhibit greater strength than large crystallites. The surface of mold 20 should be relatively smooth, although it may be desirable to treat the surface somewhat with diamond paste to provide better nucleation.

Referring again to FIG. 1 of the drawings, after providing mold 20 in the desired configuration, vapor 22 is preferably created which has the ability to nucleate synthetic diamond on mold 20. In a preferred embodiment, other carbon-bearing vapors are then applied to mold 20 to subsequently grow the diamond material. Numerous chemical vapor deposition techniques are suitable for use in the present invention as will be appreciated by those skilled in the art in light of the present disclosure. These include plasma vapor deposition techniques. The preferred technique for use in the present invention is microwave plasma deposition. Microwave plasma deposition is preferred due in part to its reliability and consistency in forming high-purity diamond deposits.

Thus, in this stage of the process, mold 20 is placed in a conventional microwave plasma deposition chamber on support or susceptor 24 which is heated by induction heating or the like. The temperature of mold 20 is then raised to between about 500° C. to 1,100° C., a range which those skilled in the art will appreciate promotes vapor phase diamond nucleation. The feedstock gases which are used to create the vapor preferably include hydrogen and a hydrocarbon gas such as methane or acetylene. A mixture of hydrogen and methane is particularly preferred. Other carbon-source gases such as methanol, ethanol, carbon dioxide, and carbon monoxide may be suitable or even preferable at the diamond growth phase. Particularly when the preferred method of microwave plasma deposition is utilized, the feedstock gas mixture may comprise from about 90 to about 99 percent by volume hydrogen and from about 1 to about 10 percent by volume carbon-source gas. A mixture of 99% by volume hydrogen and 1% by volume methane is particularly preferred for use herein. A wide range of pressures may be suitable, for example, from a fraction of a torr to several hundred torr. In the most preferred embodiment, vapor 22 initially comprises a first gas or gas mixture which optimizes nucleation, for example, the preferred 99% hydrogen and 1% methane mixture, which is then modified after initial nucleation (typically an exposure of from about 1-90 minutes) to provide a second gas or gas mixture which optimizes bulk diamond growth. A mixture of from 89-98% hydrogen, 1-10% by volume methane, and 0.1-10% by volume oxygen provides good bulk diamond growth. Concentrations outside these ranges and/or other gases or gas mixtures may also be suitable. Most preferably, the feedstock gases are maintained at a pressure of from about 20 to about 60 torr. Pressures outside these broad and preferred ranges may also be suitable in some applications. Also, the flow of feedstock gases will typically be at a rate of between about 100SCCM and 1000SCCM, depending upon the desired deposition rate. Moreover, it is to be understood that any method of forming diamond layer 26 on mold 20 may have applicability in the present invention and any such method is specifically contemplated as falling within the scope of the present invention.

Where microwave plasma deposition is utilized, as will be recognized by those skilled in the art, a range of operating frequencies is suitable. One preferred frequency is 2.45 GHz. Also, the microwave power level will typically be from about a few hundred watts up to five kilowatts. 1.5 kilowatts will be suitable for many purposes. Generally, as the power increases, the deposition rate increases; however, there is a decline in the quality of the deposit at high deposition rates using conventional deposition techniques. In some instances, a slower rate of deposition may be desirable to control crystal morphology. Although not necessarily achievable with conventional microwave deposition techniques, it may be possible to deposit as much as 200 microns of diamond per hour. Thus, the deposition rate may range anywhere from 0.01 microns per hour and up.

Referring again to FIG. 1 of the drawings, a layer of diamond 26 is shown forming on the surface of mold 20. As stated, a number of parameters dictate the rate of deposition and the microstructure of diamond layer 26. As will be appreciated, one of the significant benefits of diamond is its hardness. Hence, a relatively thin layer 26 provides good structural integrity. Therefore, in many applications a thickness of diamond layer 26 of between about 5 and about 5000 microns will be suitable. In any event, the thickness of diamond layer 26 must be such that it does not collapse or rupture as a freestanding article or during removal from mold 20.

After the formation of diamond layer 26, which as shown in the drawings conforms to the configuration of mold 20, diamond layer 26 and mold 20 are allowed to cool. In the final step, shaped diamond article 28 is removed from mold 20. As stated, at least the surface region of mold 20 is formed of a material which is releasable with respect to shaped diamond article 28. In most instances, and in the preferred embodiment of the present invention, mold 20 and shaped diamond article 28 are allowed to cool to about room temperature. As mold 20 and diamond article 28 cool, mold 20 contracts, shearing any bonds at the interface between the two materials. Thereafter, shaped diamond article 28 can simply be lifted from mold 20 as shown in the drawings. The present invention can be used to form shaped diamond articles in a wide variety of configurations which may comprise near-net shapes that are then machined or laser cut to provide the finished article. The size of shaped diamond article 28 is presumably limited only by the size of the reactor which is utilized to conduct the deposition procedures.

A number of useful articles may be fabricated in accordance with the present invention, including corrosion-resistant, high-temperature vessels such as diamond beakers, corrosion-resistant diamond funnels and numerous other diamond containers. It will be appreciated that diamond is a useful material in environments where even platinum is unsuitable. The shaped diamond articles of the present invention have superior thermal conductivity and hardness. Although it may be possible to nucleate epitaxial diamond to form single crystal diamond articles in accordance with the present invention, polycrystalline synthetic diamond is preferred for fabricating objects which will be subjected to mechanical stresses. The present invention is also suitable for fabricating articles such as journal bearings for wear surfaces. Moreover, it may be desirable in some applications to fabricate diamond articles which are then bonded to other structures such as metal or plastic. The shaped diamond articles made in accordance with the present invention may also be useful in gas chromatograph columns where corrosive materials are analyzed. Extremely durable mandrels or the like can also be formed of diamond in accordance with the present invention.

Figure 2:
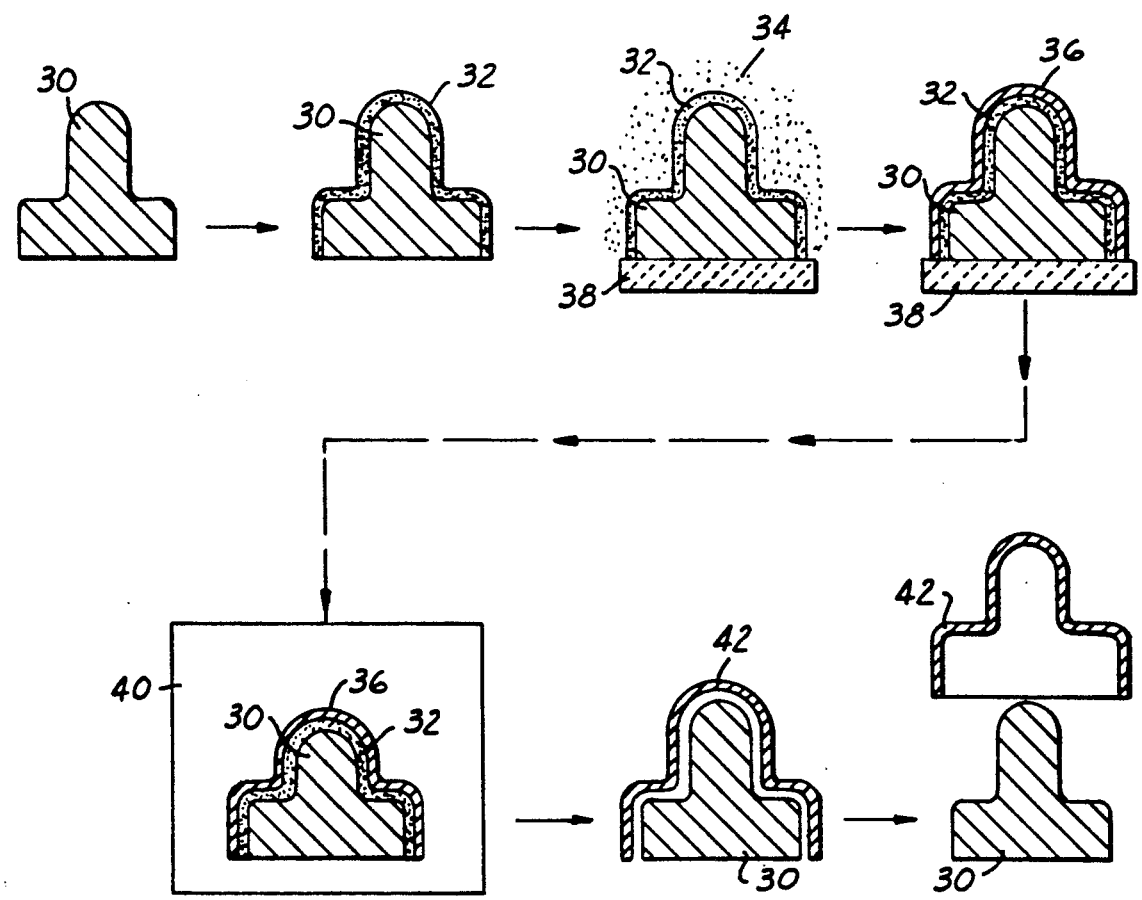
FIG. 2 illustrates the process of the present invention in that embodiment in which an etchable layer of material is formed over the mold and is then removed following deposition of a synthetic diamond layer; a diamond article produced by this method is also shown.

In still another embodiment of the present invention, and referring now to FIG. 2 of the drawings, mold 30 is provided on which the shaped diamond article to be produced is formed. In this embodiment of the present invention, mold 30 preferably has a desired preselected configuration to which the finished diamond article will conform. Mold 30 is formed of a material which is resistant to a preselected etchant as will be explained more fully. In the next step, a layer of etchable material 32 is formed on mold 30. A number of methods are suitable for forming etchable layer 32 including chemical vapor deposition, spraying, immersing mold 30 in a bath of etchable material, or by any other convenient method. As will be recognized, the precise method utilized will be dictated in part by the characteristics of the composition used to form etchable layer 32. Particularly preferred materials for use in forming etchable layer 32 are silicon, molybdenum and titanium.

Following formation of etchable layer 32, the process described in the previous embodiment for the vapor deposition of synthetic diamond is performed. That procedure most preferably includes exposure first to a diamond nucleating vapor and then to the diamond growth vapor 34 as previously explained. Vapor 34 is shown in the drawings surrounding etchable layer 32. As diamond growth occurs, diamond layer 36 is formed on etchable layer 32. As shown, diamond layer 36 takes on the configuration of underlying etchable layer 32. It will be appreciated that in most instances, mold 30 will again be supported by support or susceptor 38. Again, susceptor 38 may be conveniently heated by induction heating or the like. Once diamond layer 36 is fully formed, the structure comprising diamond layer 36, etchable layer 32 and mold 30 is placed in an etchant bath 40 which is filled with an etchant having the capacity to selectively etch etchable layer 32. Etchable layer 32 is shown in etchant bath 40 as having been partially etched away. A number of suitable etchants will be known to those skilled in the art which are capable of etching the aforementioned materials. In one particularly preferred embodiment, mold 30 is formed of molybdenum and etchable layer 32 comprises silicon. In this embodiment, the electrochemical etchant may comprise HF at a concentration of 5%. The concentration, temperature and other parameters of the etchant bath will vary according to the materials employed and the desired rate of etch.

Following the removal of etchable layer 32 in etchant bath 40, diamond article 42 is no longer bonded to mold 30 and can be simply removed from mold 30 as shown in the final illustration of FIG. 2. As in the previously described embodiment, shaped diamond articles fabricated in accordance with this embodiment of the present invention may be used in a number of applications, including as vessels and bearing surfaces.

The following example is intended to further illustrate the present invention and is in no way intended to limited scope.

EXAMPLE

A mold would be placed inside the chamber of a microwave deposition apparatus. The mold would be formed of nickel which would be machined to a predetermined configuration such as in the shape of the mold shown in FIGS. 1 and 2 of the drawings. A feedstock gas mixture comprising 1% methane and 99% hydrogen by volume would be metered into the reaction chamber at 500SCCM. The pressure inside the reaction chamber would be 30 torr. The mold would be placed on a susceptor in the chamber which would then be heated by induction heating to a temperature of 900° C. This would in turn bring the temperature of the mold to 900° C. A gas plasma would then be formed by microwave radiation at a frequency of 2.45 GHz at 1 kilowatt. Microwave energy would in turn dissociate the hydrogen and methane to form a gas plasma. Diamond crystallites would nucleate at sites on the surface of the nickel mold. After nucleation, the gas mix would be changed to the preferred mix for diamond growth. The process would continue for approximately 24 hours at which time a diamond layer of 12 microns in thickness would be formed on the nickel mold. The gas flow and microwave radiation would then be turned off, and the mold on which the diamond deposit had formed would be allowed to cool to 25° C. As the nickel mold cooled it would contract, shearing any bonds between the mold and the diamond layer. The shaped diamond article would then be removed from the mold.

Thus, it is apparent that there has been provided in accordance with the invention a method and apparatus that fully satisfies the objects, aims and advantages set forth above. While the invention has been described in connection with specific embodiments thereof, it is evident that many alternatives, modifications, and variations will be apparent to those skilled in the art in light of the foregoing description. Accordingly, it is intended to embrace all such alternatives, modifications and variations that fall within the spirit and broad scope of the appended claims.

What is claimed is:

1. A method of making shaped synthetic diamond articles comprising the steps of:

creating a first chemical vapor, said first chemical vapor including gas means for nucleating a diamond deposit on a substrate;

creating a second chemical vapor, said second chemical vapor including gas means for growing a diamond material on a nucleated surface;

providing a non-planar mold having an outer surface and a core, the outer surface of said non-planar mold being formed of metal selected from the group consisting of nickel, tungsten and molybdenum, and combinations thereof, and said core being formed of copper;

forming a layer of synthetic diamond on said non-planar mold by contacting the surface of said non-planar mold with said first chemical vapor under conditions by which a diamond deposit is nucleated and then contacting said surface with said second chemical vapor under conditions by which diamond growth occurs to form a synthetic diamond article having a configuration which mates with said non-planar mold configuration; and cooling said non-planar mold and said synthetic diamond layer to a temperature at which said non-planar mold contracts causing said synthetic diamond layer to separate from said non-planar mold to form a shaped synthetic diamond article.

2. A process for fabricating a synthetic diamond article, comprising creating a first chemical vapor, said first chemical vapor including gas means for nucleating a diamond deposit on a substrate;

creating a second chemical vapor, said second chemical vapor including gas means for growing a diamond material on a nucleated surface;

providing a non-planar mold, the surface of said non-planar mold being capable of nucleating diamond growth in association with said first chemical vapor, wherein said non-planar mold has the ability to release a layer of diamond formed thereon by vapor deposition;

forming a layer of synthetic diamond on said non-planar mold by contacting the surface of said non-planar mold with said first chemical vapor under conditions by which a diamond deposit is nucleated and then contacting said surface with said second chemical vapor under conditions by which diamond growth occurs to form a synthetic diamond article having a configuration which mates with said non-planar mold configuration; and removing said synthetic diamond article from said non-planar mold by cooling said non-planar mold and said synthetic diamond layer to a temperature at which said non-planar mold separates from said non-planar mold to form a synthetic diamond article.

* * * * *